(12) United States Patent
Hayashi

(10) Patent No.: US 8,623,172 B2
(45) Date of Patent: Jan. 7, 2014

(54) GAS FLOW PATH STRUCTURE AND SUBSTRATE PROCESSING APPARATUS

(75) Inventor: Daisuke Hayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 909 days.

(21) Appl. No.: 12/749,642

(22) Filed: Mar. 30, 2010

(65) Prior Publication Data

US 2010/0243166 A1    Sep. 30, 2010

Related U.S. Application Data

(60) Provisional application No. 61/242,609, filed on Sep. 15, 2009.

(30) Foreign Application Priority Data

Mar. 31, 2009    (JP) ................... 2009-086036

(51) Int. Cl.
*C23C 16/00*     (2006.01)
*C23F 1/00*      (2006.01)
*H01L 21/306*    (2006.01)
*C23C 16/455*    (2006.01)
*C23C 16/50*     (2006.01)
*C23C 16/503*    (2006.01)

(52) U.S. Cl.
USPC ............. 156/345.33; 118/715; 118/723 E; 156/345.1; 156/345.34; 156/345.47

(58) Field of Classification Search
USPC ........... 118/723 E, 715; 156/345.33, 345.34, 156/345.47, 345.1
See application file for complete search history.

(56) References Cited

U.S. PATENT DOCUMENTS

| | | | | | |
|---|---|---|---|---|---|
| 4,360,499 | A | * | 11/1982 | Gubitose et al. | 117/211 |
| 4,868,490 | A | * | 9/1989 | Blumenthal | 324/715 |
| 5,232,508 | A | * | 8/1993 | Arena et al. | 118/719 |
| 5,266,119 | A | * | 11/1993 | Taniguchi et al. | 118/730 |
| 7,068,926 | B2 | * | 6/2006 | Nozaki | 392/416 |
| 7,718,004 | B2 | * | 5/2010 | Satoh et al. | 118/715 |
| 2004/0261712 | A1 | * | 12/2004 | Hayashi et al. | 118/723 E |

FOREIGN PATENT DOCUMENTS

| | | |
|---|---|---|
| JP | 05-299370 A | 11/1993 |
| JP | 2003-137200 A | 5/2003 |
| JP | 2008-112589 A | 5/2008 |

* cited by examiner

*Primary Examiner* — Jeffrie R Lund
*Assistant Examiner* — Benjamin Kendall
(74) *Attorney, Agent, or Firm* — Pearne & Gordon LLP

(57) ABSTRACT

A substrate processing apparatus includes: a depressurizable processing chamber 11; a shaft 26 supporting a facing electrode 24 provided within the processing chamber 11 while allowing the facing electrode 24 to be movable with respect to a mounting electrode 12; a first ring-shaped bellows 31 concentrically installed at an outer peripheral portion of the shaft 26; and a second bellows 32 concentrically installed at an outer peripheral portion of the first bellows 31. The first bellows 31 absorbs a displacement of the facing electrode 24 with respect to a wall surface 13 at a penetration portion where the shaft 26 penetrates the wall surface 13 of the processing chamber 11, and seals the inside of the processing chamber 11 against the ambient atmosphere around the shaft 26. A ring-shaped gas flow path 35 is formed by the first bellows 31 and the second bellows 32.

5 Claims, 5 Drawing Sheets

GAS FLOW PATH STRUCTURE AND SUBSTRATE PROCESSING APPARATUS

CROSS-REFERENCE TO RELATED APPLICATION

This application claims the benefit of Japanese Patent Application No. 2009-086036 filed on Mar. 31, 2009, and U.S. Provisional Application Ser. No. 61/242,609 filed on Sep. 15, 2009, the entire disclosures of which are incorporated herein by reference.

FIELD OF THE INVENTION

The present disclosure relates to a gas flow path structure and a substrate processing apparatus. More particularly, the present disclosure relates to a gas flow path structure used in a substrate processing apparatus having a movable electrode, and to a substrate processing apparatus including the gas flow path structure.

BACKGROUND OF THE INVENTION

A substrate processing apparatus, which performs a plasma process on a semiconductor wafer (hereinafter, simply referred to as a "wafer") serving as a substrate, includes a chamber (processing chamber) that accommodates a wafer therein and can be depressurized; a susceptor (mounting table) installed at a lower part within the chamber; and a shower head (upper electrode) provided within the chamber so as to face the susceptor. The susceptor is configured to mount the wafer thereon and serves as a mounting electrode applying a high frequency power from a connected high frequency power supply into the chamber. The shower head introduces a processing gas into the chamber. Further, the shower head is grounded to serve as a facing electrode. In this substrate processing apparatus, the processing gas supplied into the chamber is excited into plasma by the high frequency power, and the wafer is plasma-processed by the plasma.

Conventionally, in order to appropriately distribute the plasma in a space between the shower head and the susceptor, there has been developed a substrate processing apparatus having a movable susceptor, thereby adjusting a thickness (hereinafter, referred to as a "gap") of the space between the shower head and the susceptor. Besides, on account of the restriction on the layout around the substrate processing apparatus, a substrate processing apparatus having a movable shower head, not the movable susceptor, is recently under development.

FIG. 4 is a cross sectional view schematically illustrating a configuration of a conventional substrate processing apparatus having a movable shower head.

In a substrate processing apparatus 100 of FIG. 4, a shower head 103 is installed within a cylindrical chamber 101 so as to face a susceptor 102. The shower head 103 is formed into a substantially circular plate shape having an outer diameter substantially the same as an inner diameter of the chamber 101. The shower head 103 is configured to vertically move like a piston within the chamber 101 by a non-illustrated lift mechanism. In FIG. 4, the shower head 103 at the lowermost position is indicated by a solid line, and the shower head 103 at the uppermost position is indicated by a dashed line.

The shower head 103 includes a processing gas introducing unit having a gas flow path 104, a buffer room 105, and gas holes 106; and a gas feed pipe 107 connected to a gas supply source (not shown) for supplying a processing gas into the processing gas introducing unit from the outside. Further, a bellows 112 having a hermetically sealing function is concentrically installed at an outer peripheral portion of a shaft 111 on which the shower head 103 as a vertically movable electrode is held. Since the gas supply source is typically fixed and not moved while the shower head 103 moves up and down as stated above, the gas feed pipe 107 needs to be bent depending on a vertical movement of the shower head 103.

Typically, a flexible tube is known as a pipe for feeding a fluid toward a movable component from a fixed fluid supply source. For example, the flexible tube has been used as a pliable heat insulating pipe for feeding liquefied nitrogen toward a movable door shroud from a vacuum container in a space environment simulator (see, for example, Patent Document 1).

As shown in FIG. 5, however, since a flexible tube 108 includes a thin metal pipe 109 on which a plurality of waves is formed; and a metal mesh blade 110 enclosing the metal pipe 109, it has a relatively high stiffness against bending and thus is lack of flexibility. Accordingly, when the flexible tube 108 is largely bent, a great stress may be easily generated. Thus, when such a flexible tube is employed together with a movable component having a long displacement (moving distance), it may be broken in an early stage. Accordingly, it is difficult to use the flexible tube 108 as the gas feed pipe for supplying the processing gas into the shower head 103 which frequently moves up and down while having a long displacement of, e.g., about 70 mm in a vertical direction.

That is, the flexible tube is not designed to be repetitively bent, and it has a finite lifetime due to an irregular breakdown. Accordingly, the flexible tube needs to be replaced in a cycle of about one year, thus raising a safety issue related to the lifetime. Further, an integrally formed bellows not designed to be bent repetitively raises the same problem as that of the flexible tube. Thus, it is difficult to use such a bellows as the gas feed pipe for supplying the processing gas into the shower head 103 which frequently moves up and down.

Meanwhile, using a rotary joint coupler at a movable portion of the gas feed pipe may be considered. Since, however, the rotary joint has a physical sliding part, it may be difficult to avoid particle generation. Thus, its application to the substrate processing apparatus in which the particle generation largely affects a quality of a final product is deemed to be unpractical.

Further, it may be considered to use a bellows instead of the flexible tube or the rotary joint coupler. The bellows includes a metal pipe formed by coupling several circular ring-shaped members (hereinafter, referred to as "pieces") each having a mountain-like longitudinal cross sectional shape. Thus, the bellows has a relatively low stiffness against bending and has a sufficiently high flexibility. Accordingly, even when it is applied as a displacement-absorbing member for the shower head 103 which frequently moves a long distance, it may not be broken in an early stage because no great stress is generated thereon.

Patent Document 1: Japanese Patent Laid-open Publication No. 2003-137200

However, although a bellows having a relatively low stiffness against bending and a high flexibility is used as the gas feed pipe for supplying a gas into the vertically-moving shower head, an installation space for the bellows needs to be additionally secured if the bellows is used only for the gas pipe. Accordingly, it is difficult to secure the installation space on a top surface of an upper unit of the substrate processing apparatus including many components. Thus, there arises a layout problem.

Further, since the bellows is of a higher price as compared to the flexible tube or the like, the length and the number of bellows used in the apparatus need to be minimized.

BRIEF SUMMARY OF THE INVENTION

In view of the foregoing, the present disclosure provides a gas flow path structure capable of supplying a gas to a movable electrode with a high reliability without raising a layout problem in securing an installation space; and also provides a substrate processing apparatus using the gas flow path structure.

In order to solve the above-mentioned problem, in accordance with one aspect of the present disclosure, there is provided a gas flow path structure of a substrate processing apparatus that performs a plasma process on a processing target substrate by plasma excited from a processing gas supplied between a mounting electrode and a facing electrode via a gas flow path. The substrate processing apparatus includes a depressurizable processing chamber, the mounting electrode installed within the processing chamber and configured to mount the processing target substrate, and the facing electrode installed so as to face the mounting electrode. The gas flow path structure includes: a supporting member configured to support either one of the mounting electrode and the facing electrode while allowing the one electrode to be movable with respect to the other; a first displacement-absorbing pressure partition wall having a ring shape and installed at an outer peripheral portion of the supporting member so as to be concentric with the supporting member, the first partition wall serving to absorb a displacement (moving distance) of the one electrode with respect to a wall surface of the processing chamber at a penetration portion where the supporting member penetrates the wall surface and serving to seal an inside of the processing chamber against an ambient atmosphere around the supporting member; and a second displacement-absorbing pressure partition wall having a ring shape and installed at an outer peripheral portion of the first displacement-absorbing pressure partition wall so as to be concentric with the first displacement-absorbing pressure partition wall. Further, a first ring-shaped gas flow path is formed by the first displacement-absorbing pressure partition wall and the second displacement-absorbing pressure partition wall.

In the gas flow path structure, a third or more displacement-absorbing pressure partition walls having a ring shape are further installed at an outer peripheral portion of the second displacement-absorbing pressure partition wall so as to be concentric with the second displacement-absorbing pressure partition wall, so that a second or more ring-shaped gas flow paths are formed by each pair of adjacent displacement-absorbing pressure partition walls outside the second displacement-absorbing pressure partition wall.

In the gas flow path structure, a guide member, which suppresses bending of the first displacement-absorbing pressure partition wall in a direction perpendicular to a lengthwise direction thereof, is installed so as to face an outer peripheral portion of the first displacement-absorbing pressure partition wall.

In the gas flow path structure, the displacement-absorbing pressure partition walls have a circular, an oval, or a rectangular cross section.

In the gas flow path structure, the displacement-absorbing pressure partition walls are bellows.

Further, in accordance with another aspect of the present disclosure, there is provided a substrate processing apparatus including a depressurizable processing chamber; a mounting electrode installed within the processing chamber and configured to mount a processing target substrate; a facing electrode installed so as to face the mounting electrode; and a gas flow path structure that supplies a processing gas between the mounting electrode and the facing electrode. Furthermore, plasma is excited from the processing gas supplied between the mounting electrode and the facing electrode, and a plasma process is performed on the processing target substrate by the plasma. Moreover, the gas flow path structure includes: a supporting member configured to support either one of the mounting electrode and the facing electrode while allowing the one electrode to be movable with respect to the other; a first displacement-absorbing pressure partition wall having a ring shape and installed at an outer peripheral portion of the supporting member so as to be concentric with the supporting member, the first partition wall serving to absorb a displacement (moving distance) of the one electrode with respect to a wall surface of the processing chamber at a penetration portion where the supporting member penetrates the wall surface and serving to seal an inside of the processing chamber against an ambient atmosphere around the supporting member; and a second displacement-absorbing pressure partition wall having a ring shape and installed at an outer peripheral portion of the first displacement-absorbing pressure partition wall so as to be concentric with the first displacement-absorbing pressure partition wall. Further, a first ring-shaped gas flow path is formed by the first displacement-absorbing pressure partition wall and the second displacement-absorbing pressure partition wall.

The above-mentioned gas flow path structure and the above-mentioned substrate processing apparatus include: the supporting member configured to support either one of the mounting electrode and the facing electrode while allowing the one electrode to be movable with respect to the other; the first displacement-absorbing pressure partition wall having a ring shape and installed at the outer peripheral portion of the supporting member so as to be concentric with the supporting member, the first partition wall serving to absorb the displacement (moving distance) of the one electrode with respect to the wall surface of the processing chamber at the penetration portion where the supporting member penetrates the wall surface and serving to seal the inside of the processing chamber against the ambient atmosphere around the supporting member; and the second displacement-absorbing pressure partition wall having a ring shape and installed at the outer peripheral portion of the first displacement-absorbing pressure partition wall so as to be concentric with the first displacement-absorbing pressure partition wall. Further, the first ring-shaped gas flow path is formed by the first displacement-absorbing pressure partition wall and the second displacement-absorbing pressure partition wall. Thus, the gas flow path absorbing the displacement according to the movement of the electrode may be provided within the processing chamber. With this configuration, no layout problem may be caused in securing the installation space for the gas flow path structure. Furthermore, the gas can be supplied stably by absorbing the displacement (moving distance) of the movable electrode effectively, and reliability of the gas flow path structure can be improved.

In the gas flow path structure, the third or more displacement-absorbing pressure partition walls having a ring shape are further installed at the outer peripheral portion of the second displacement-absorbing pressure partition wall so as to be concentric with the second displacement-absorbing pressure partition wall, so that the second or more ring-shaped gas flow paths are formed by each pair of adjacent displacement-absorbing pressure partition walls outside the second displacement-absorbing pressure partition wall. Therefore, the gas flow path structure can be applied to the substrate processing apparatus using multiple kinds of processing gases.

In the gas flow path structure, the guide member, which suppresses bending of the first displacement-absorbing pressure partition wall in the direction perpendicular to the lengthwise direction thereof, is installed so as to face the outer peripheral portion of the first displacement-absorbing pressure partition wall. Therefore, buckling (deformation) of the first partition wall that is exposed to an inside atmosphere and an outside vacuum can be suppressed.

In the gas flow path structure, the displacement-absorbing pressure partition walls have a circular, an oval, or a rectangular cross section. Therefore, the partition wall can be modified in various ways.

In the gas flow path structure, the displacement-absorbing pressure partition walls are bellows. Therefore, since the gas can be supplied successfully by absorbing the displacement of the movable electrode according to its movement, the reliability of the gas flow path structure can be improved, and particle generation can be minimized.

BRIEF DESCRIPTION OF THE DRAWINGS

The disclosure may best be understood by reference to the following description taken in conjunction with the following figures.

DETAILED DESCRIPTION OF THE INVENTION

Hereinafter, embodiments of the present disclosure will be described with reference to the accompanying drawings.

Figure 1:
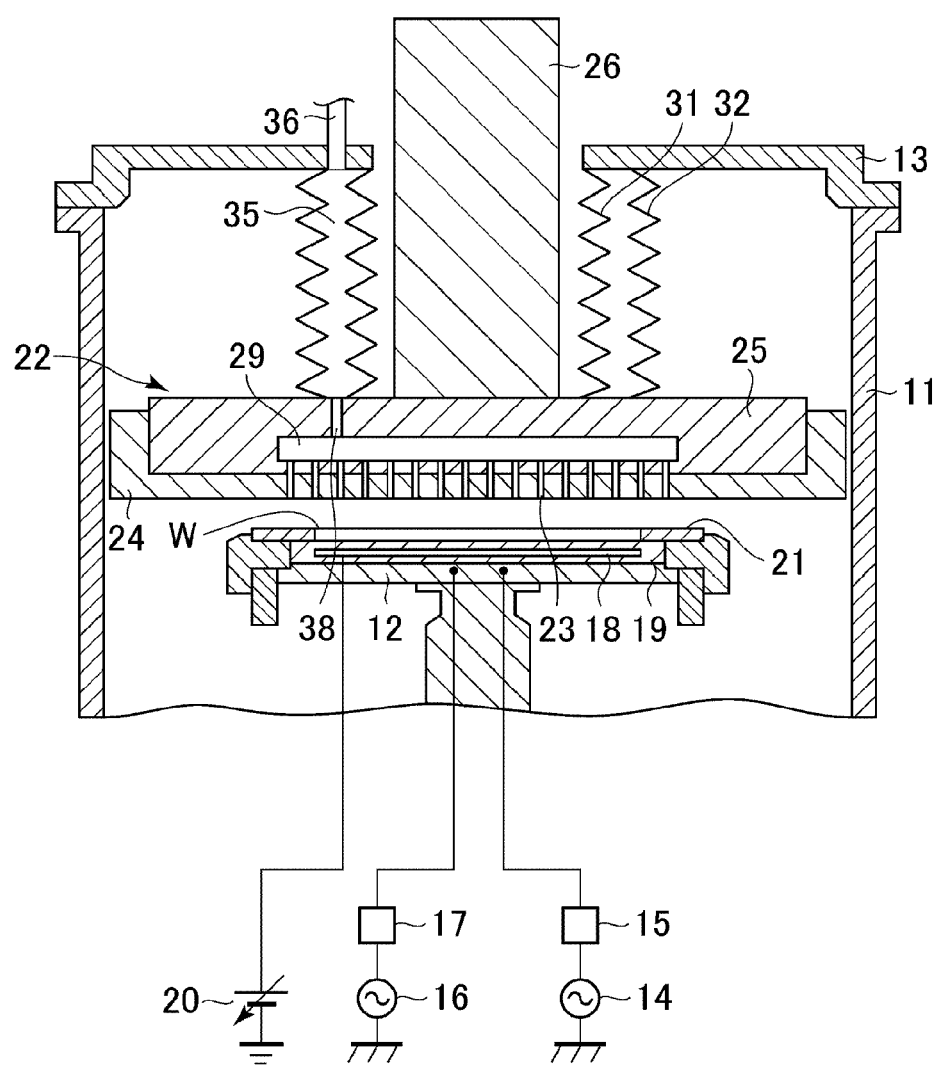
FIG. 1 is a cross sectional view schematically illustrating a configuration of a substrate processing apparatus in accordance with an embodiment of the present disclosure.

FIG. 1 is a cross sectional view schematically illustrating a configuration of a substrate processing apparatus having a gas flow path structure in accordance with an embodiment of the present disclosure. The substrate processing apparatus is configured to form so as to perform dry etching process on a wafer.

In FIG. 1, a substrate processing apparatus 10 includes a cylindrical chamber (processing chamber) 11 that accommodates a wafer W having a diameter of, e.g., about 300 mm. Installed in a lower part of the chamber 11 is a circular plate-shaped susceptor (mounting electrode) 12 configured to mount thereon the wafer W for a semiconductor device. An upper part of the chamber 11 is covered by an openable/closable cover 13 having a circular plate shape.

The inside of the chamber 11 is depressurized by a TMP (Turbo Molecular Pump), a DP (Dry Pump) (both are not illustrated), and the like, and a pressure within the chamber 11 is controlled by an APC valve (not illustrated). Further, since even nano-sized particles may cause a defect when adhered to the semiconductor device, a cleaning process is performed in the chamber 11 prior to a dry etching process, thereby eliminating the particles.

The susceptor 12 is connected with a first high frequency power supply 14 via a first matching unit 15 and with a second high frequency power supply 16 via a second matching unit 17. The first high frequency power supply 14 is configured to apply a high frequency bias power of a relatively low frequency of, e.g., about 3.2 MHz to the susceptor 12. The second high frequency power supply 16 is configured to apply a plasma-generating high frequency power having a relatively high frequency of, e.g., about 40 MHz to the susceptor 12. The susceptor 12 is configured to apply the plasma-generating power to the inside of the chamber 11.

Installed at an upper part of the susceptor 12 is an electrostatic chuck 19 having therein an electrostatic electrode 18. The electrostatic chuck 19 is made of a circular plate-shaped ceramic member, and the electrostatic electrode 18 is connected with a DC power supply 20. When a positive DC voltage is applied to the electrostatic electrode 18, a negative potential is generated on a wafer W's surface (hereinafter, referred to as a "rear surface") facing the electrostatic chuck 19. As a result, a potential difference is created between the electrostatic electrode 18 and the rear surface of the wafer W. Accordingly, the wafer W is attracted to and held on the electrostatic chuck 19 by Coulomb force or Johnson-Rahbek force generated by the potential difference.

Further, a ring-shaped focus ring 21 is mounted on the susceptor 12 so as to surround the wafer W attracted to and held on the electrostatic chuck 19. The focus ring 21 is made of a conductive material such as single crystalline silicon which is the same material as that forming the wafer W. Since the focus ring 21 is made of the conductive material, plasma can be distributed onto the focus ring 21 as well as onto the wafer W. Therefore, a plasma density at a peripheral portion of the wafer W can be maintained substantially the same as a plasma density at a central portion thereof. Thus, uniformity of the dry etching process can be maintained on the entire surface of the wafer W.

A shower head 22 is installed above the susceptor 12, while facing it. The shower head 22 includes a conductive upper electrode 24 having a plurality of gas holes 23; a cooling plate 25 on which the upper electrode 24 is attachably/detachably held; and a shaft 26 as a supporting member on which the cooling plate 25 is held. The upper electrode 24 is grounded and serves as a grounding electrode (facing electrode) for the plasma-generating power applied to the inside of the chamber 11. An outer diameter of the upper electrode 24 is substantially the same as an inner diameter of the chamber 11, and the upper electrode 24 is installed within the chamber 11 in a movable state.

The shaft 26 penetrates the cover 13, and an upper portion of the shaft 26 is connected to a lift mechanism (not illustrated) located above the substrate processing apparatus 10. The lift mechanism is configured to move the shaft 26 in a vertical direction. Along with the movements of the shaft 26, the shower head 22 having the upper electrode 24 also moves up and down like a piston within the chamber 11. Accordingly, a gap, i.e., a thickness of a space between the shower head 22 and the susceptor 12 can be adjusted. A maximum moving distance of the shower head 22 in the vertical direction is, e.g., about 70 mm.

Particles may be generated due to a friction between the shaft 26 and the cover 13. Therefore, an outer peripheral surface of the shaft 26 is enclosed by a first bellows 31 serving as a first displacement-absorbing pressure partition wall. The shaft 26 has a columnar shape, and the cylindrical first bellows 31 is arranged concentrically with the shaft 26. An upper end of the first bellows 31 is joined to a bottom surface of the cover 13, and a lower end of the first bellows 31 is coupled to a top surface of the cooling plate 25. With this configuration, a displacement (moving distance) of the electrode with respect to the cover (wall surface) 13 is absorbed at a penetration portion where the shaft 26 penetrates the cover 13. Further, the first bellows 31 seals the inside of the processing chamber 11 against the ambient atmosphere around the shaft 26. Thus, the inside of the chamber 11 remains isolated from the atmosphere.

A second bellows 32 having a circular cross section is concentrically provided at an outer peripheral portion of the first bellows 31 to be located adjacent thereto. The second bellows 32 serves as a second displacement-absorbing pressure partition wall. The second bellows 32 has a diameter suitable for providing a gap between the first bellows 31 and the second bellows 32. An upper end of the second bellows 32 is coupled to the bottom surface of the cover 13, and a lower end of the second bellows 32 is fastened to the top surface of the cooling plate 25. The gap between the first and second bellows 31 and 32 serves as a gas flow path 35. The gas flow path 35 is connected with a gas supply system (not shown) through a processing gas supply pipe 36 that penetrates the cover 13. Further, the gas flow path 35 communicates with a buffer room 29 within the cooling plate 25 through a gas hole 38. The buffer room 29 communicates with the inside of the chamber 11 through the gas holes 23. A processing gas is introduced from the gas supply system into the gas flow path 35 formed by the first and second bellows 31 and 32 through the processing gas supply pipe 36. Then, the processing gas is introduced into the buffer room 29 within the cooling plate 25 through the gas hole 38 and then into the chamber 11 through the gas holes 23.

Figure 2:
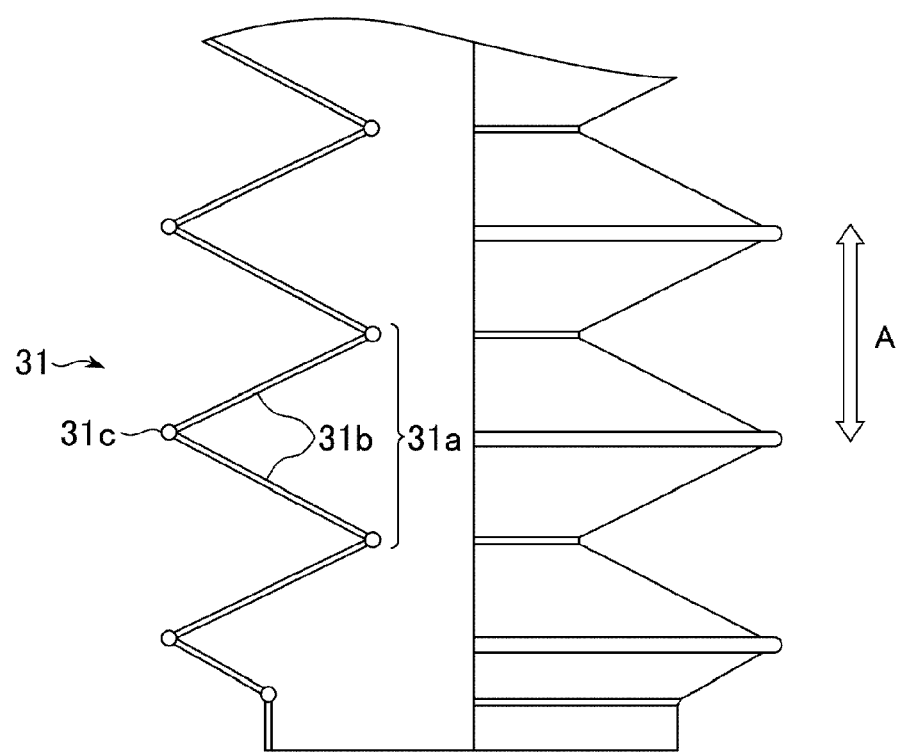
FIG. 2 is a partial enlarged view of a first bellows (second bellows) of FIG. 1.

FIG. 2 is a partial enlarged view of the first bellows (second bellows). In FIG. 2, a left half of the drawing is a cross sectional view, while a right half is a side view.

In FIG. 2, the first bellows 31 includes a metal pipe formed by connecting a multiple number of circular ring-shaped members (hereinafter, referred to as "pieces") 31a in a lengthwise direction. Each piece 31a has a mountain-like longitudinal (lengthwise) cross sectional shape. Each piece 31a includes two circular ring-shaped metal plates 31b formed in tapered shapes. By welding one ends of the two metal plates 31b together, they are joined to each other. That is, since the two metal plates 31b of each piece 31a are joined just at a welded part 31c at the top of the mountain-like shape, they have low stiffness against expansion/contraction in a direction indicated by an arrow A in FIG. 2 while having high flexibility. Thus, the bellows is easily expanded and contracted in a direction indicated by an arrow A. Further, each piece 31a has a circular ring-shaped cross section in a direction perpendicular to the lengthwise direction. Since each piece 31a is made of a metal, the first bellows 31 is hardly deformed.

Referring back to FIG. 1, the non-illustrated lift mechanism is operated to move the shower head 22 up and down. As the lift mechanism is driven, a relative position of the shower head 22 coupled to the shaft 26 with respect to the susceptor 12 varies. Since, however, the first and second bellows 31 and 32 forming the gas flow path 35 are expanded and contracted depending on the vertical movements of the shower head 22, a change in the relative position of the shower head 22 is absorbed. As a result, the gas flow path 35 is kept connected with the processing gas supply system so that it can always supply the processing gas even when the shower head 22 moves up and down.

An operation of each part of the above-described substrate processing apparatus 10, e.g., the first high frequency power supply 14 or the second high frequency power supply 16 is controlled by a CPU of a control unit (not shown) of the substrate processing apparatus 10 according to a program corresponding to a dry etching process.

In the substrate processing apparatus 10 having the above-described configuration, to distribute plasma appropriately, the gap between the susceptor 12 and the shower head 22 is controlled by moving the shaft 26 up and down by means of driving the lift mechanism (not shown). Then, the processing gas is supplied into the chamber 11 via the processing gas supply pipe 36. The processing gas flowing through the processing gas supply pipe 36 is introduced into the gas flow path 35 after particles are filtered by, e.g., a filter installed on the middle of the processing gas supply pipe 36. Then, the particle-free processing gas is introduced into the chamber 11 via the buffer room 29 within the cooling plate 25 and the gas holes 23. The processing gas introduced in the chamber 11 is excited into plasma by a plasma-generating power applied to the inside of the chamber 11.

Positive ions in the plasma are attracted toward the wafer W on the susceptor 12 due to a negative bias potential generated by a bias power applied to the susceptor 12. As a result, a dry etching process is performed on the wafer W.

In accordance with the present embodiment discussed above, the gas flow path for introducing the processing gas between the susceptor 12 and the shower head 22 of the substrate processing apparatus 10 is formed by the expansible/contractible first and second bellows 31 and 32 that are arranged concentrically around the shaft 26 supporting the shower head 22. Thus, an installation space for the gas flow path can be secured easily. Furthermore, since the displacement of the shower head 22 can be absorbed according to the vertical movement of the shower head 22, the processing gas can be supplied stably and successfully, thus improving reliability of the apparatus.

In accordance with the present embodiment, the first bellows 31, which is previously installed in the substrate processing apparatus having the vertically movable shower head, to be used as a pressure partition wall that isolates the space within the chamber from the atmosphere. The first bellows 31 is utilized as a member that forms the expansible/contractible gas flow path 35. Thus, a structure for expanding/contracting the gas flow path and a structure for absorbing the vertical movement of the shower head can be integrated as one body, so that an increase of the number of necessary components can be minimized. Furthermore, since the expansible/contractible gas flow path 35 is installed within the chamber, a structure in the upper part of the chamber may not be complicated.

In the present embodiment, desirably, the first bellows 31 and the second bellows 32 have inner diameters equal to or larger than, e.g., about 100 mm ϕ. Accordingly, conductance of the gas flow path 35 increases as compared to a typical gas pipe, whereby the gap between the first and second bellows 31 and 32 can be greatly shortened, for example. The width of the gap between the first and second bellows 31 and 32 mostly relies on the design of an operating margin of the bellows. However, a minimum gap of, e.g., about 10 mm, needs to be provided in order to cope with an interruption of the vertical movement such as buckling (deformation).

In the present embodiment, since the bellows has high flexibility for the expansion and contraction and no great stress is generated when the bellows expands and contracts, an early breakdown of the gas flow path 35 can be avoided. Thus, the reliability of the apparatus can be improved.

In the present embodiment, although the first and second bellows 31 and 32 have the circular cross sections, they may have other cross sectional shapes such as ovals, rectangles or the like.

In the present embodiment, only the first bellows 31 functions as a pressure partition wall that isolates a space within the chamber from the atmosphere. Accordingly, the first bellows 31 needs to withstand a pressure condition of 'internal pressure>>external pressure' as compared to the second bellows 32. Thus, a means to prevent buckling (deformation) (e.g., installation of a guide) needs to be prepared for the first bellows 31. For example, it is desirable to install a guide member for preventing buckling (deformation) at an outer peripheral portion of the first bellows 31.

The second bellows 32 is provided to form the gas flow path 35. The gas flow path 35 communicates with the inside of the chamber 11 and is depressurized to the same level as the inside of the chamber 11. Accordingly, the function of isolating the vacuum from the atmosphere is not so much required for the second bellows 32 as compared to the first bellows 31. Further, even when three or more bellows are arranged concentrically to form multiple gas flow paths, a vacuum stress applied to the bellows other than the first bellows may not be great.

Further, in the present embodiment, although the bellows is used as a displacement-absorbing partition wall, a sliding seal structure having a ferrofluid seal may be used instead of the bellows. In such a case, however, a countermeasure against particle generation needs to be prepared because the sliding seal structure has a sliding member.

Although the present embodiment has been described for the configuration where the shower head 22 moves up and down, the present disclosure is also applicable to a configuration where the susceptor 12 installed in the lower part of the chamber 11, for example, moves up and down. To elaborate, when the susceptor 12 moves up and down and a gas needs to be supplied to this susceptor 12 from outside, a gas flow path connected with an external gas supply source can be formed within the substrate processing apparatus by arranging a plurality of bellows concentrically around a shaft that supports the susceptor 12 while allowing vertical movements thereof.

Figure 3:
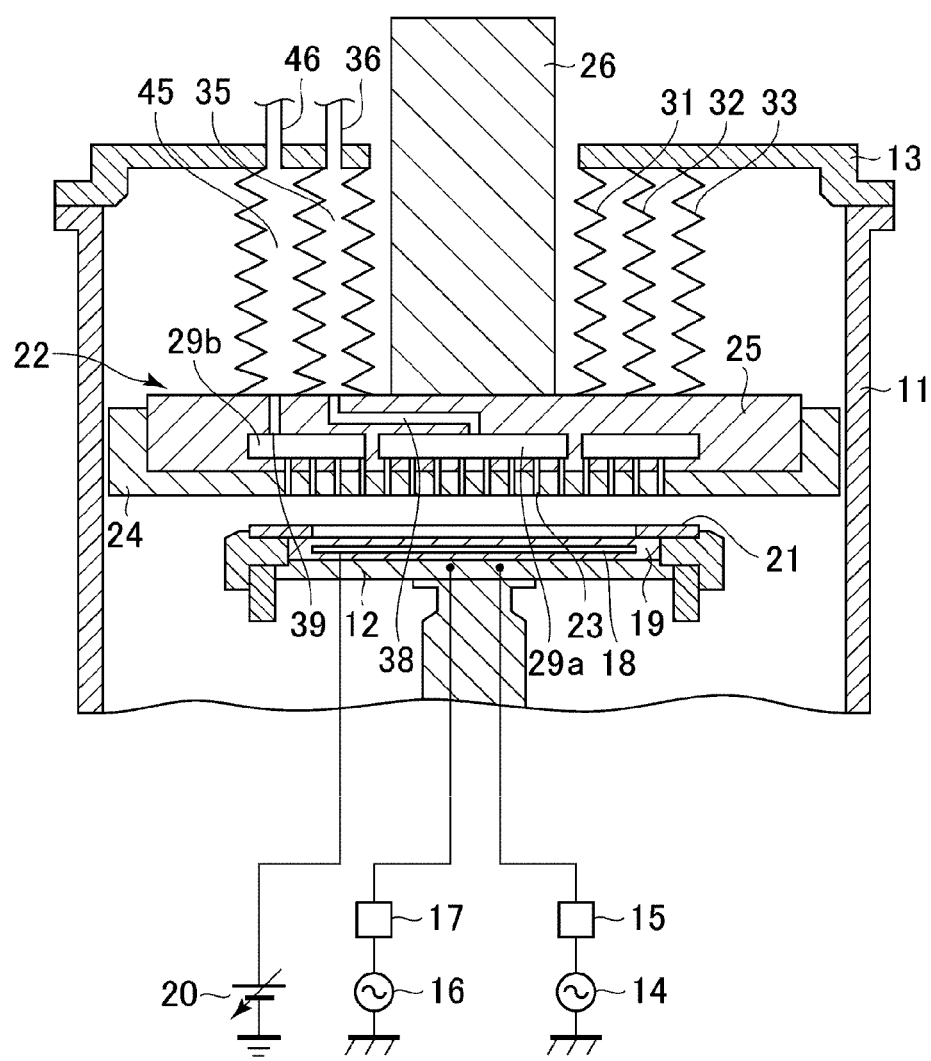
FIG. 3 is a cross sectional view schematically illustrating a modification example of the embodiment of the present disclosure.
Figure 4:
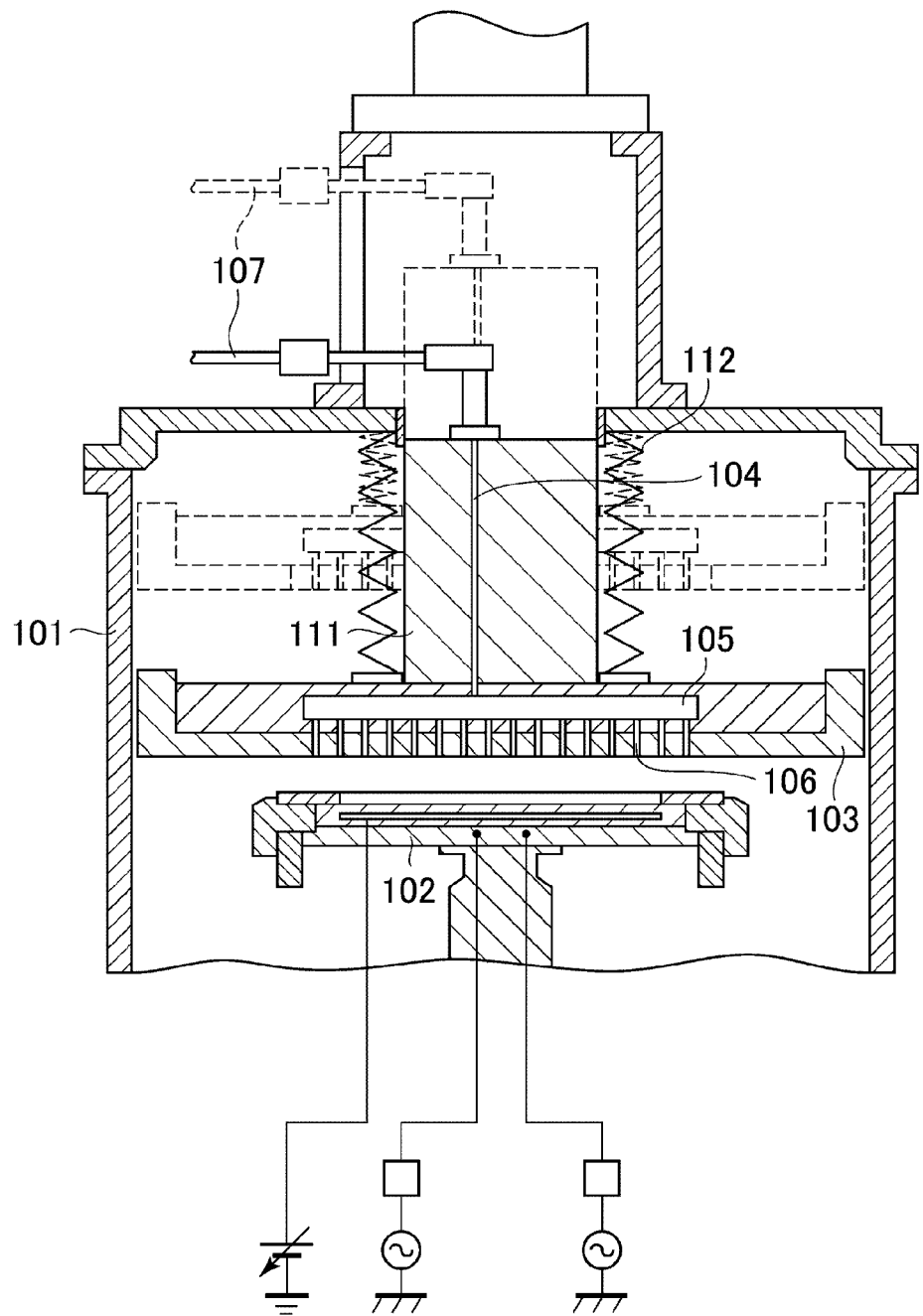
FIG. 4 is a cross sectional view schematically illustrating a configuration of a conventional substrate processing apparatus having a movable shower head.
Figure 5:
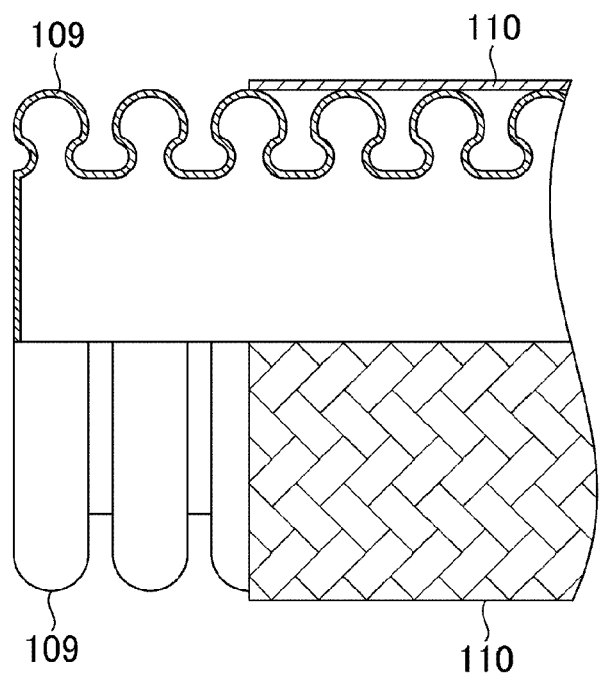
FIG. 5 is a partial enlarged view of a flexible tube.

FIG. 3 is a cross sectional view schematically illustrating a modification example of the present embodiment.

In a substrate processing apparatus in FIG. 3, two processing gas supply systems and two gas flow paths as in the substrate processing apparatus of FIG. 1 are provided so as to supply two different kinds of gases into the chamber 11. In FIG. 3, the same parts as those described in FIG. 1 will be assigned same reference numerals, and redundant description thereof will be omitted.

The substrate processing apparatus 50 is different from the substrate processing apparatus in FIG. 1 in that a third bellows 33 is installed at an outer peripheral portion of a second bellows 32 while being spaced apart from the second bellows 32, and a gap between the second bellows 32 and the third bellows 33 serves as a second gas flow path 45. Further, a buffer room 29 is divided into an inner buffer room 29a and an outer buffer room 29b. A first gas flow path 35 communicates with the inner buffer room 29a via a gas hole 38, while the second flow path 45 communicates with the outer buffer room 29b via a gas hole 39.

In the substrate processing apparatus 50 having the above-described configuration, two different kinds of processing gases are supplied into the first gas flow path 35 and the second gas flow path 45 via a processing gas supply pipe 36 and a processing gas supply pipe 46, respectively. Further, for example, filters capable of filtering even a very small or minute amount of particles from the processing gases are installed on the middle of the processing gas supply pipes 36 and 46. A first kind of processing gas is introduced into the gas flow path 35 after particles therein are removed by the filter. Then, the first kind of processing gas is introduced into the chamber 11 via the gas hole 38, the buffer room 29a and gas holes 23. Further, a second kind of processing gas is introduced into the gas flow path 45 after particles therein are filtered by the filter. Then, the second kind of processing gas is introduced into the chamber 11 via the gas hole 39, the buffer room 29b and other gas holes 23. The two different kinds of processing gases introduced in the chamber 11 are excited into plasma by a plasma-generating power applied to the inside of the chamber 11.

Positive ions in the plasma are attracted toward a wafer W on a susceptor 12 due to a negative bias potential generated by a bias power applied to the susceptor 12. As a result, a dry etching process is performed on the wafer W.

As in the above-described embodiment, an installation space for the gas flow paths can also be easily secured in this example. Furthermore, since a displacement of a shower head 22 can be absorbed according to a vertical movement of the shower head 22, the processing gas can be supplied stably and successfully, thus improving reliability of the apparatus.

In this modification example, the number of the gas flow paths is not limited to two, but three or more gas flow paths may be provided by increasing the number of concentrically arranged bellows.

Furthermore, in the above-discussed embodiment, although the wafer for the semiconductor device has been described as the substrate on which the dry etching process is performed, the substrate is not limited thereto, and it can be, e.g., a glass substrate for a FPD (Flat Panel Display) including a LCD (Liquid Crystal Display).

What is claimed is:

1. A gas flow path structure of a substrate processing apparatus that performs a plasma process on a processing target substrate by plasma excited from a processing gas supplied between a mounting electrode and a facing electrode via a gas flow path, the substrate processing apparatus including a depressurizable processing chamber, the mounting electrode installed within the processing chamber and configured to mount the processing target substrate, and the facing electrode installed so as to face the mounting electrode and provided below the gas flow path structure, the gas flow path structure comprising:

a supporting member configured to support the facing electrode while allowing the facing electrode to be movable with respect to the mounting electrode;

a first displacement-absorbing pressure partition wall having a ring shape and installed at an outer peripheral portion of the supporting member so as to be concentric with the supporting member, the first displacement-absorbing pressure partition wall serving to absorb a displacement of the facing electrode with respect to a ceiling of the processing chamber at a penetration portion where the supporting member penetrates the ceiling and serving to seal an inside of the processing chamber against an ambient atmosphere around the supporting member; and a second displacement-absorbing pressure partition wall having a ring shape and installed at an outer peripheral portion of the first displacement-absorbing pressure partition wall so as to be concentric with the first displacement-absorbing pressure partition wall, wherein a first ring-shaped gas flow path is formed by the first displacement-absorbing pressure partition wall and the second displacement-absorbing pressure partition wall, the processing gas is supplied between the mounting electrode and the facing electrode via the first ring-shaped gas flow path, an upper end of the first displacement-absorbing pressure partition wall and an upper end of the second displacement-absorbing pressure partition wall are joined to the ceiling of the processing chamber, the first ring-shaped gas flow path is connected to a processing gas supply pipe that penetrates the ceiling of the processing chamber, and the processing gas moves downstream from the processing gas supply pipe to the first ring-shaped gas flow path and further downstream to a space between the mounting electrode and the facing electrode.

2. The gas flow path structure of claim 1, wherein a third or more displacement-absorbing pressure partition walls having a ring shape are further installed at an outer peripheral portion of the second displacement-absorbing pressure partition wall so as to be concentric with the second displacement-absorbing pressure partition wall, so that a second or more ring-shaped gas flow paths are formed by each pair of adjacent displacement-absorbing pressure partition walls outside the second displacement-absorbing pressure partition wall.

3. The gas flow path structure of claim 1, wherein the displacement-absorbing pressure partition walls have a circular, an oval, or a rectangular cross section.

4. The gas flow path structure of claim 1, wherein the displacement-absorbing pressure partition walls are bellows.

5. A substrate processing apparatus comprising:
a depressurizable processing chamber;
a mounting electrode installed within the processing chamber and configured to mount a processing target substrate;
a facing electrode installed so as to face the mounting electrode; and
a gas flow path structure, as claimed in claim 1, that supplies a processing gas between the mounting electrode and the facing electrode,
wherein plasma is excited from the processing gas supplied between the mounting electrode and the facing electrode, and a plasma process is performed on the processing target substrate by the plasma.

* * * * *